United States Patent [19]

Morinville et al.

[11] Patent Number: 5,709,754
[45] Date of Patent: Jan. 20, 1998

[54] METHOD AND APPARATUS FOR REMOVING PHOTORESIST USING UV AND OZONE/OXYGEN MIXTURE

[75] Inventors: Keith Morinville; J. Brett Rolfson, both of Boise, Id.

[73] Assignee: Micron Technology, Inc., Boise, Id.

[21] Appl. No.: 581,107

[22] Filed: Dec. 29, 1995

[51] Int. Cl.$^6$ .................................................. B08B 7/00
[52] U.S. Cl. ................... 134/1.3; 134/1; 134/2; 134/32
[58] Field of Search .................. 134/1, 1.3, 32, 134/2; 156/643.1, 646.1, 662.1

[56] References Cited

U.S. PATENT DOCUMENTS

| | | | |
|---|---|---|---|
| 4,341,592 | 7/1982 | Shortes et al. | 156/643.1 |
| 4,885,047 | 12/1989 | Ury et al. | 156/345 |
| 5,114,834 | 5/1992 | Nachshon | 430/329 |
| 5,173,441 | 12/1992 | Yu et al. | 437/173 |
| 5,206,515 | 4/1993 | Elliott et al. | 250/492.2 |
| 5,215,592 | 6/1993 | Jackson | 134/1 |
| 5,346,586 | 9/1994 | Keller | 156/656 |

*Primary Examiner*—Jill Warden
*Assistant Examiner*—Alexander Markoff
*Attorney, Agent, or Firm*—Stephen A. Gratton

[57] ABSTRACT

A method and apparatus for removing photoresist from a substrate such as a semiconductor wafer are provided. The method includes placing the substrate in a reaction chamber containing an oxidizing gas that includes an ozone/oxygen mixture. At the same time, a UV laser beam is directed across the surface of the photoresist for driving an oxidation reaction. Specifically, the oxone decomposes into atomic and diatomic oxygen which react with carbon in the photoresist to form gaseous by-products such as (CO) and ($CO_2$). These by-products are continuously exhausted from the reaction chamber by an evacuation pump. The method can be performed in stages wherein a first oxidizing gas comprising ($O_2$) is used to remove a bulk of the photoresist and a second oxidizing gas comprising ($O_3/O_2$) is used to remove a remaining portion of the photoresist.

14 Claims, 1 Drawing Sheet

METHOD AND APPARATUS FOR REMOVING PHOTORESIST USING UV AND OZONE/OXYGEN MIXTURE

FIELD OF THE INVENTION

This invention relates generally to semiconductor manufacture and specifically to an improved method and apparatus for removing photoresist from a substrate following a lithography process.

BACKGROUND OF THE INVENTION

The technique of photolithography is frequently used in semiconductor manufacture to pattern and etch different materials formed on a silicon wafer. Typically this technique involves coating the wafer with a layer of photoresist (i.e., resist) and exposing the photoresist with an exposure energy (e.g., UV radiation) passed through a mask. A desired pattern is thus imaged on the photoresist which can be developed to form a photoresist mask. The photoresist mask includes open areas that allow an underlying substrate such as silicon, metal or an insulator to be further processed. For example, photoresist masks are used for etching, ion implanting, lift-off processes and high temperature postbakes in the manufacture of semiconductor wafers.

Prior to subsequent processing of the wafer, the layer of photoresist must be removed, or stripped, from the underlying substrate. During this process the object is to remove the photoresist as quickly as possible without effecting the underlying materials. One technique for removing photoresist from a semiconductor wafer is wet chemical etching. For example, organic strippers such as phenol based formulations are often used to break down the resist structure for removal. A problem with these strippers is that the phenol is a toxic element and can be difficult to dispose. In addition, some phenol based strippers will attack an underlying metal layer.

Wet inorganic strippers, such as solutions of $H_2SO_4$, are also used to strip photoresist from non-metal surfaces using an oxidation process. Inorganic strippers are typically heated (e.g., 140° C.) and function to convert the carbon in the resist to $CO_2$ which leaves as a gas. One particularly virulent inorganic stripper is a 4:1 solution of concentrated $H_2SO_4$ and $H_2O_2$. This mixture is sometimes referred to as a "piranha" etch. As with organic strippers, disposal of the by-products of inorganic strippers can also be a problem. In addition, with either organic or inorganic strippers mechanical scrubbing is sometimes required to remove all remnants of the resist.

Dry etching techniques are also used to remove resist from a wafer. With dry etching, an oxygen plasma is generated in a plasma etch chamber. This technique is also known as "plasma ashing". Free radicals contained within the plasma cause oxidation of the resist into by-products such as water, carbon monoxide and carbon dioxide. One disadvantage of dry etching is that it typically has to be followed with a wet clean. Additionally, it can cause damage to the underlying substrate.

One recently developed technique uses deep UV radiation to heat and vaporize a layer of photoresist from a substrate. The UV radiation can be generated by an excimer laser that produces a laser beam having a wavelength of about 150–250 nanometers. U.S. Pat. No. 5,206,515 to Elliott et al. describes a deep UV beam delivery system that can be used to strip a substrate for photolithography.

Using this type of UV source, the wafer can be placed in an $O_2$ atmosphere and moved slowly through a sealed reaction chamber past the laser beam. The laser beam provides UV energy for driving an oxidation reaction to decompose the photoresist into by-products such as CO, $CO_2$ and $H_2O$. The reactive by-products are continuously exhausted by an exhaust pump. This process has fewer disposal problems than wet chemical etching and can be more efficient than conventional dry etching techniques.

One problem with this photoresist removal technique is that although the bulk of the photoresist is removed from the wafer, a thin layer of photoresist often remains. Although the remnant layer may be only a few monolayers thick, it can be a source of contamination during subsequent processing of the wafer.

In view of the foregoing, it is an object of the present invention to provide an improved method for removing photoresist from a substrate. It is a further object of the present invention to provide an improved method for removing photoresist that totally removes all traces of photoresist from the underlying substrate. It is a still further object of the present invention to provide an improved method for removing photoresist that utilizes a UV laser and an ozone/oxygen oxidizing gas. It is yet another object of the present invention to provide an improved method for removing photoresist that is efficient, low cost and adaptable to volume semiconductor manufacture. Other objects, advantages and capabilities of the present invention will become more apparent as the description proceeds.

SUMMARY OF THE INVENTION

In accordance with the present invention, an improved method and apparatus for removing photoresist from a substrate are provided. The method, simply stated, comprises, oxidizing a layer of photoresist in a reaction chamber containing an oxidation gas coupled to a UV laser beam and containing an ozone/oxygen mixture. The UV laser beam vaporizes the photoresist and drives an oxidation reaction wherein gaseous by-products are formed at the surface of the photoresist and exhausted. The ozone provides diatomic ($O_2$) and atomic (O) oxygen which react with carbon in the photoresist to form (CO) and ($CO_2$).

The method can be performed by moving the substrate past a focused UV laser beam to form a high energy reaction area at the surface of the photoresist to vaporize and oxidize the photoresist. In addition, the method can be performed in multiple passes wherein an oxygen containing oxidation gas is used to remove a bulk of the photoresist and an ozone/oxygen mixture is used to remove a thin remnant layer (e.g., <100 Å).

An apparatus for performing the method includes a reaction chamber in flow communication with a source of oxygen and an ozone forming means. In addition, the apparatus includes a laser source for generating a UV laser beam, a conveyor that moves the substrate across the path of the UV laser beam, and an exhaust pump for removing gaseous by-products. The ozone can be formed in situ within the reaction chamber using UV radiation generated by lamps directed at an oxidation gas comprising oxygen. Alternately, or in combination with the UV lamps, an ozone generator can be used to supply an ozone/oxygen gas mixture to the reaction chamber at a predetermined ratio of ozone to oxygen.

DETAILED DESCRIPTION OF THE PREFERRED EMBODIMENTS

Figure 1:
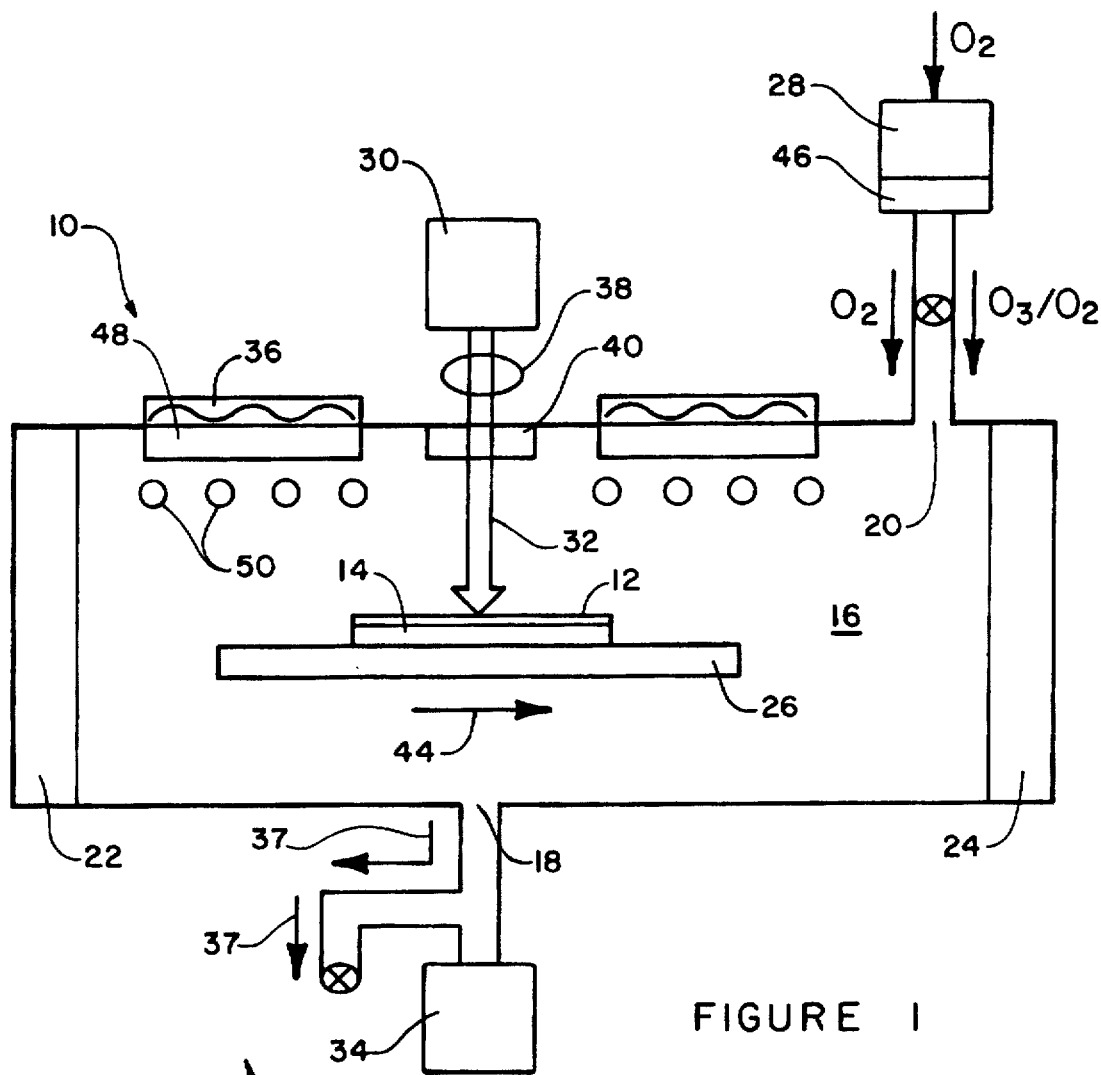
FIG. 1 is a schematic diagram of an apparatus constructed in accordance with the invention.

With reference to FIG. 1, an apparatus 10 for removing a layer of photoresist 12 from a silicon wafer 14 in accordance with the invention is shown. The apparatus 10 includes a reaction chamber 16 in flow communication with a supply conduit 20 for supplying an oxidation gas containing $O_2$ to the reaction chamber 16 and an exhaust conduit 18 for exhausting reactive by-products. The apparatus 10 also includes a wafer loader 22 and a wafer unloader 24 operatively associated with a conveyor 26 for moving the wafer 14 through the reaction chamber 16.

In addition, the apparatus includes a laser source 30 for directing a UV laser beam 32 across the surface of the wafer 14. The apparatus 10 also includes means for forming ozone within the reaction chamber 16, in the form of UV lamps 36 for directing UV radiation at the oxidation gas within the reaction chamber 16, and an ozone generator 28 in flow communication with the reaction chamber 16. The UV lamps 36 provide in situ ozone generation by converting ($O_2$) within the reaction chamber 16 to ($O_3$). The ozone generator 28 injects an ($O_2/O_3$) mixture into the reaction chamber 16 at a predetermined temperature and ratio of ($O_2$) to ($O_3$). The UV lamps 36 and ozone generator 28 can be used separately or in combination with one another.

The reaction chamber 16 is a sealed chamber adapted to contain oxidation gases at a slight vacuum pressure and at room temperature or greater. The reaction chamber 16 can be formed of an inert material such as stainless steel or quartz. The reaction chamber 16 is in flow communication with an evacuation pump 34. The pressure within the reaction chamber during the photoresist removal process can be controlled by controlling the operation of the evacuation pump 34. A representative pressure range within the reaction chamber 16 is from 25 mTorr–750 Torr. The evacuation pump 34 can be an oil sealed pump or other mechanical pump suitable for maintaining a vacuum pressure and removing by-products from the reaction chamber 16. Exhaust gases are continuously pumped through the exhaust conduit 18 by the evacuation pump 34 and exhausted as indicated by exhaust arrows 37.

The reaction chamber 16 is also in flow communication with a supply of an oxidation gas that can be injected into the reaction chamber 16 via the supply conduit 20. The oxidation gas includes ($O_2$) of which a portion is converted to ($O_3$) by the UV lamps 36. The UV lamps 36 are situated externally of the reaction chamber 16 but direct UV radiation though sapphire or quartz windows 48 into the reaction chamber 16. A wavelength for the UV lamps 36 can be about 172 nm. A dispersion manifold 50, in flow communication with an ($O_2$) source, can be operatively associated with the UV lamps 36 to evenly disburse the resultant ($O_2/O_3$) mixture.

The ozone generator 28 is in flow communication with the supply conduit 20 for the reaction chamber 16. The ozone generator 28 is adapted to inject ozone ($O_3$) and oxygen ($O_2$) at a predetermined flow rate and ratio of ozone to oxygen into the reaction chamber 16. The concentration of the ozone as a percentage of oxygen is preferably from about 2% to about 50% by volume (i.e., % vol. $O_3$/% vol. $O_2$=2% to 50%). The ozone generator 28 can be a commercially available unit such as a silent discharge ozone generator. Suitable ozone generators are manufactured by PCI, Astex and Griffin Techniques Corp. and other manufacturers. In general, the ozone generator 28 is in flow communication with a source of pure oxygen and converts a portion of the oxygen to ozone.

In addition to being supplied to the reaction chamber 28 at a predetermined ratio of ozone to oxygen, the ozone/oxygen mixture is also transported to the reaction chamber 16 at a predetermined temperature. This can be accomplished using a heat exchanger 46 operably associated with the ozone generator 28 to cool the gas mixture exiting from the ozone generator 28. The temperature of the ozone/oxygen mixture is room temperature or less, preferably about 10° C. to about 25° C. Cooling the incoming ozone/oxygen mixture helps to maintain the stability of the mixture during transport and injection into the reaction chamber 16 and helps to prevent the ozone in the mixture from converting back to oxygen. A flow rate of the ozone/oxygen mixture will be on the order of about 200 standard cubic centimeters per minute (sccm) to 20 or more standard liters per minute. The flow of the oxidation gas is preferably counter to the direction of motion 44 of the conveyor 26.

The wafer loader 22 is preferably an automated loader that includes a pick and place robot for picking the photoresist covered wafers 14 out of a cassette (not shown) and placing them on the conveyor 26. The conveyor 26 is similar in construction to a conventional flat wafer boat adapted to support and move the wafer 14 on its backside with a face of the wafer 14 exposed. The conveyor 26 moves the wafer 14 through the reaction chamber 16 as indicated by directional arrow 44. The speed of the conveyor 26 is relatively slow (e.g., 1–10 mm/sec) such that the wafer 14 is exposed to the oxidizing atmosphere for a relatively long time period (e.g., 1 to 3 minutes). The wafer unloader 24 removes the cleaned wafers 14 from the conveyor 26 for placement in an unload cassette (not shown).

The laser source 30 directs the laser beam 32 through the oxidizing gases contained within the reaction chamber 16 and at the face of the wafer 14. The laser beam 32 thus functions to heat the photoresist 12 and the oxidizing gases immediately above the wafer 14. The laser source 30 can be a conventional excimer laser capable of producing pulses of about 1–100 milliJoules per square centimeter ($mJ/cm^2$) at a pulse duration of 20–25 ns and at a repetition rate of up to several hundred per second. The wavelength of the laser beam 32 can be a standard UV wavelength (e.g., 193 nm, 248 nm).

Figure 2:
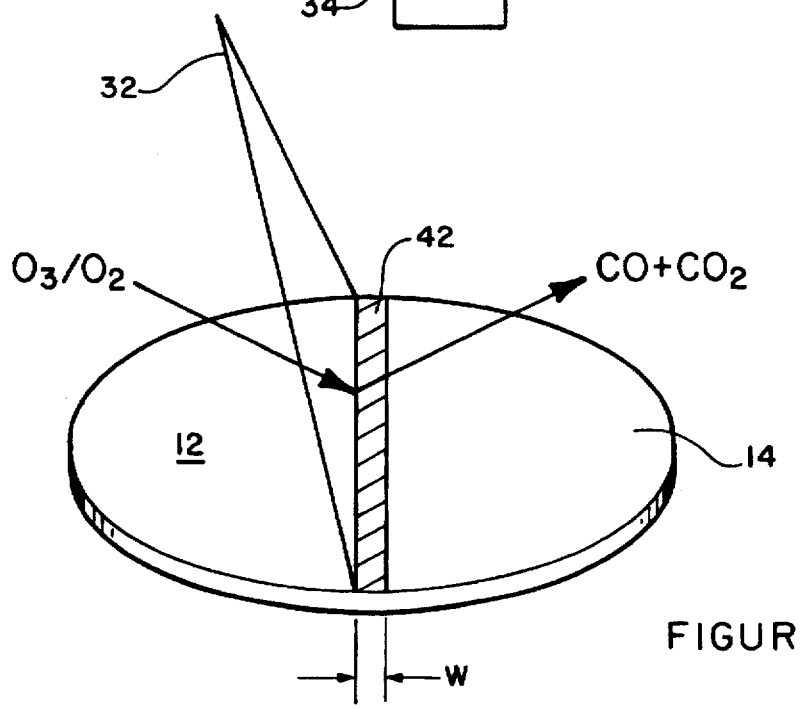
FIG. 2 is a schematic diagram of a wafer having a layer of photoresist being removed in accordance with the invention.

The laser beam 32 is focused by a lens 38 and passes through a window 40 into the reaction chamber 16. The window 40 can be formed of a transparent material, such as quartz. As shown in FIG. 2, the lens 38 focuses the laser beam 32 onto the photoresist 12 in a generally rectangular shaped band of light 42. The length of the band of light 42 is sufficient to extend across the diameter of the wafer 14. For a standard sized wafer the length of the band of light 42 can be about 200 mm or greater. The width (w) of the band of light 42 can be about 0.25 mm or less. The angle of incidence of the laser beam 32 can be orthogonal to the plane of the wafer 14 or can be angled as shown in FIG. 2. A representative range for the angle of incidence of the laser beam 32 can be from 30° to 90°.

As the conveyor 26 moves the wafer 14 through the reaction chamber 16, the band of light 42 moves across the surface of the wafer 14 and heats the layer of photoresist 12. The dwell time of the band of light 42 at the surface of the wafer 14 is thus determined by the speed of the conveyor 26. This speed can be about 4 to 8 mm/second.

In addition, the fluence per pulse of the laser beam 32, must transmit enough energy to cause a heated reaction area in the vicinity to the band of light 42. This heated reaction area includes the surface of the photoresist 12 and the oxidation gases just above the surface of the photoresist 12. A temperature of the oxidation gases and surface of the photoresist, in the heated reaction area, will be on the order of 600° C. at the time of the laser pulse but will drop significantly (e.g., to 300° C.) within a micro second of the pulse. In this reaction area the chemical bonds which form the photoresist 12 are broken and oxygen contained in the oxidation gases reacts with carbon in the photoresist 12 to form byproducts.

Specifically, within the heated reaction area, atomic oxygen (O) and diatomic oxygen ($O_2$) react with carbon (C) in the photoresist 12 to form (CO) and ($CO_2$). Normally diatomic oxygen ($O_2$) is very difficult to break into atomic oxygen. However, because ozone ($O_3$) decomposes into diatomic oxygen ($O_2$) and atomic oxygen (O), with ozone ($O_3$) present in the oxidizing gas, a large number of free oxygen atoms (O) are available to combine with carbon to form (CO) and ($CO_2$). In other words, the presence of ozone ($O_3$) in the oxidizing gases provides more free oxygen atoms for oxidation and thus speeds the oxidation process without an increased energy expenditure.

These reactions can be characterized by the formulas:

$$O_3 = O_2 + O$$

$$UV\ energy + O + C = CO$$

$$UV\ energy + 2O + C = CO_2$$

$$UV\ energy + O_2 + C = CO_2$$

A bulk temperature within the reaction chamber 16 during the photoresist removal process is dependent on the temperature of the incoming gases, the power of the UV lamps 36 and on the fluency of the laser beam 32. A bulk temperature range for the oxidation gases within the reaction chamber 16 is from 10° to 50° C. However, the temperature of the oxidation gases in the heated reaction area adjacent to the band of light 42 will be much higher.

A representative process sequence for the apparatus can include loading of the wafer 14 and sealing of the reaction chamber 16. This is followed by purging of the reaction chamber 16 such as with an inert gas. Following purging of the reaction chamber 16, the flow of oxidation gases is initiated and the wafer 14 is moved past the laser beam 32 as previously described. The wafer 14 can be moved back and forth across the laser beam 32 in several passes (e.g., 2–20 passes).

In addition, the bulk of the photoresist 12 can be removed using a first oxidation gas comprising ($O_2$) followed by one or more final passes with a second oxidation gas comprising ($O_3/O_2$) to remove any remnants of the resist. By way of example, wafers 14 coated with photoresist 12 to a thickness of 5000–15,000 Å can be stripped using an oxidation gas comprising ($O_2$) such that all but the last 25–100 Å of photoresist 12 is removed. This remnant layer of photoresist can then be stripped using an oxidation gas comprising ($O_3/O_2$). When the oxidation process is completed, an unload cycle can be initiated such that the wafer unloader 24 removes the cleaned wafer 14 from the conveyor 26.

Thus the invention provides an improved method and apparatus for removing photoresist using an ozone/oxygen oxidation gas and a UV laser beam. Although the method and apparatus of the invention have been described with reference to certain preferred embodiments, as will be apparent to those skilled in the art, certain changes and modifications can be made without departing from the scope of the invention as defined by the following claims.

What is claimed is:

1. A method for removing photoresist from a substrate comprising:

providing a reaction chamber;

placing the substrate in the reaction chamber;

injecting a first oxidizing gas into the reaction chamber, said first oxidizing gas comprising oxygen;

moving the substrate through the reaction chamber in a first pass;

directing a UV laser beam at the photoresist during the first pass to remove at least some of the photoresist;

injecting a second oxidizing gas different than the first oxidizing gas into the reaction chamber, said second oxidizing gas comprising oxygen and ozone; and moving the substrate through the reaction chamber in a second pass while directing the UV laser beam at the photoresist to remove a remainder of the photoresist.

2. The method as claimed in claim 1 further comprising cooling said second oxidizing gas to a temperature between about 10° C. to 25° C. prior to injection into the reaction chamber.

3. A method for removing photoresist from a substrate comprising:

providing a reaction chamber;

injecting a first oxidizing gas into the reaction chamber, said first oxidizing was comprising oxygen;

moving the substrate through the reaction chamber in a first pass;

directing a UV laser beam at the photoresist during the first pas to remove at least some of the photoresist;

injecting a second oxidizing gas different than the first oxidizing gas into the reaction chambers, said second oxidizing gas comprising an oxygen/ozone gas mixture having an ozone concentration by volume percentage of oxygen off from 2% to 50%;

moving the substrate through the reaction chamber in a second pass;

directing a UV laser beam at the photoresist during the second pass to remove a remainder of the photoresist.

4. The method as claimed in claim 3 further comprising cooling said second oxidizing gas prior to injection into the reaction chamber to a temperature of between about 10° C. to 25° C.

5. The method as claimed in claim 3 further comprising generating ozone gas in situ within the reaction chamber during the second pass by directing UV radiation from UV lamps into the reaction chamber.

6. A method for removing photoresist from a substrate comprising:

providing a reaction chamber;

placing the substrate in the reaction chamber;

injecting a first oxidizing gas into the reaction chamber, said first oxidizing gas comprising oxygen;

moving the substrate through the reaction chamber in a first pass;

directing a UV laser beam at the photoresist during the first pass to remove at least some of the photoresist;

injecting or generating a second oxidizing gas different than the first oxidizing gas within the reaction chamber, said second oxidizing gas comprising an oxygen/ozone mixture;

moving the substrate through the reaction chamber in a second pass while directing the UV laser beam at the photoresist to remove a remainder of the photoresist; and exhausting by-products from the reaction chamber during the first and second passes.

7. The method as claimed in claim 6 further comprising providing an ozone generator in flow communication with the reaction chamber for injecting the second oxidizing gas into the reaction chamber.

8. The method as claimed in claim 7 further comprising cooling the second oxidizing gas to a temperature of about 10° C. to about 25° C. prior to injection into the reaction chamber.

9. The method as claimed in claim 8 wherein cooling the second oxidizing gas comprises cooling with a heat exchanger in flow communication with the ozone generator.

10. The method as claimed in claim 8 further comprising dispersing the first and second oxidation gases using a dispersion manifold within the reaction chamber.

11. The method as claimed in claim 6 wherein the substrate comprises at least a portion of a semiconductor wafer.

12. The method as claimed in claim 6 wherein moving the substrate is performed at a speed of 1–10 mm/sec.

13. The method as claimed in claim 6 further comprising evacuating the reaction chamber during the injecting steps to a pressure of between 25 mTorr to 750 Torr.

14. The method as claimed in claim 6 wherein directing the laser beam at the substrate is performed at an angle of incidence of from 30° to 90°.

* * * * *